US010170606B2

(12) United States Patent
Shinsho

(10) Patent No.: US 10,170,606 B2
(45) Date of Patent: Jan. 1, 2019

(54) INSULATED GATE BIPOLAR TRANSISTOR AND DIODE

(71) Applicant: ROHM CO., LTD., Kyoto-shi, Kyoto (JP)

(72) Inventor: Kohei Shinsho, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/640,825

(22) Filed: Jul. 3, 2017

(65) Prior Publication Data

US 2018/0012982 A1  Jan. 11, 2018

(30) Foreign Application Priority Data

Jul. 6, 2016 (JP) ................................ 2016-134335

(51) Int. Cl.
*H01L 29/739* (2006.01)
*H01L 29/41* (2006.01)
(Continued)

(52) U.S. Cl.
CPC ........ *H01L 29/7397* (2013.01); *H01L 23/482* (2013.01); *H01L 29/083* (2013.01);
(Continued)

(58) Field of Classification Search
CPC .... H01L 29/66325–29/66348; H01L 29/7393; H01L 29/7395–29/7397;
(Continued)

(56) References Cited

U.S. PATENT DOCUMENTS

| 2010/0276727 | A1* | 11/2010 | Storasta | H01L 29/0834 |
| | | | | 257/133 |
| 2013/0087829 | A1* | 4/2013 | Tanabe | H01L 29/66348 |
| | | | | 257/140 |
| 2017/0317175 | A1* | 11/2017 | Naito | H01L 27/0664 |

FOREIGN PATENT DOCUMENTS

JP        2010263215 A    11/2010

* cited by examiner

*Primary Examiner* — Selim Ahmed
*Assistant Examiner* — Evan Clinton
(74) *Attorney, Agent, or Firm* — Hamre, Schumann, Mueller & Larson, P.C.

(57) ABSTRACT

A semiconductor device includes a semiconductor layer having a first principal surface on one side thereof and a second principal surface on the other side thereof, a channel region of a first conductivity type formed at a surface layer portion of the first principal surface of the semiconductor layer, an emitter region of a second conductivity type formed at a surface layer portion of the channel region in the semiconductor layer, a drift region of the second conductivity type formed in a region of the second principal surface side with respect to the channel region in the semiconductor layer so as to be electrically connected to the channel region, a collector region of the first conductivity type formed at a surface layer portion of the second principal surface of the semiconductor layer so as to be electrically connected to the drift region, a cathode region of the second conductivity type formed at a surface layer portion of the second principal surface of the semiconductor layer so as to be electrically connected to the drift region and including a continuously laid around line-shaped pattern, and a gate electrode formed at the first principal surface side of the semiconductor layer so as to face the channel region across an insulating film.

15 Claims, 11 Drawing Sheets

(51) Int. Cl.
*H01L 29/417* (2006.01)
*H01L 29/08* (2006.01)
*H01L 23/482* (2006.01)
*H01L 29/66* (2006.01)

(52) U.S. Cl.
CPC ........ *H01L 29/41* (2013.01); *H01L 29/41708* (2013.01); *H01L 29/41716* (2013.01); *H01L 29/66348* (2013.01); *H01L 29/7393* (2013.01); *H01L 29/7394* (2013.01)

(58) Field of Classification Search
CPC ....... H01L 2924/13055; H01L 29/7394; H01L 23/482; H01L 29/083; H01L 29/41716; H01L 29/41708; H01L 29/41
See application file for complete search history.

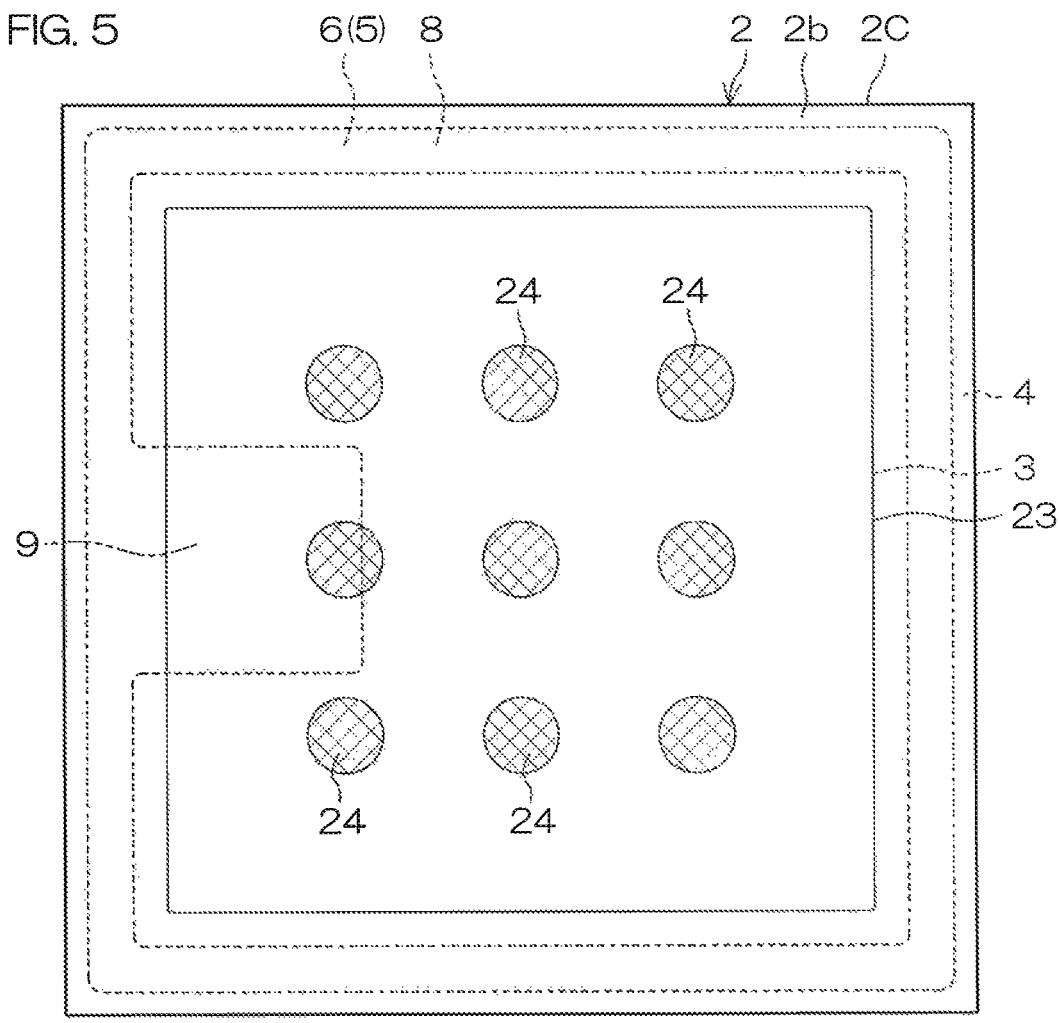
FIG. 5
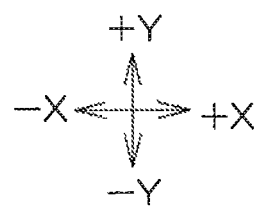

INSULATED GATE BIPOLAR TRANSISTOR AND DIODE

BACKGROUND OF THE INVENTION

1. Field of the Invention

The present invention relates to a semiconductor device.

2. Description of the Related Art

A Reverse Conducting—Insulated Gate Bipolar Transistor (an RC-IGBT), which includes a diode and an IGBT, is disclosed in FIG. 2 of U.S. 2010/276727.

The RC-IGBT includes a semiconductor layer. A p type channel region is formed at a surface layer portion of the semiconductor layer. An n type emitter region is formed at a surface layer portion of the channel region. An n type drift region is formed so as to be electrically connected to the channel region at a rear surface side of the semiconductor layer with respect to the channel region of the semiconductor layer.

At a surface layer portion of the rear surface of the semiconductor layer, a p type collector region is formed so as to be electrically connected to the drift region. A plurality of n type cathode regions is formed so as to be electrically connected to the drift region at surface layer portions of the rear surface of the semiconductor layer. The plurality of n type cathode regions is formed in a matrix pattern at the rear surface of the semiconductor layer.

SUMMARY OF THE INVENTION

A preferred embodiment of the present invention provides a semiconductor device that includes a semiconductor layer having a first principal surface on one side thereof and a second principal surface on the other side thereof, a channel region of a first conductivity type formed at a surface layer portion of the first principal surface of the semiconductor layer, an emitter region of a second conductivity type formed at a surface layer portion of the channel region in the semiconductor layer, a drift region of the second conductivity type formed in a region of the second principal surface side with respect to the channel region in the semiconductor layer so as to be electrically connected to the channel region, a collector region of the first conductivity type formed at a surface layer portion of the second principal surface of the semiconductor layer so as to be electrically connected to the drift region, a cathode region of the second conductivity type formed at a surface layer portion of the second principal surface of the semiconductor layer so as to be electrically connected to the drift region and including a continuously laid around line-shaped pattern, and a gate electrode formed at the first principal surface side of the semiconductor layer so as to face the channel region across an insulating film.

The above and other objects, features, and effects of the present invention will be made clear by the following description of the preferred embodiments with reference to the accompanying drawings.

BRIEF DESCRIPTION OF THE DRAWINGS

FIG. 5 is a bottom view of a semiconductor device according to a reference example.

DETAILED DESCRIPTION OF THE PREFERRED EMBODIMENTS

Figure 1:
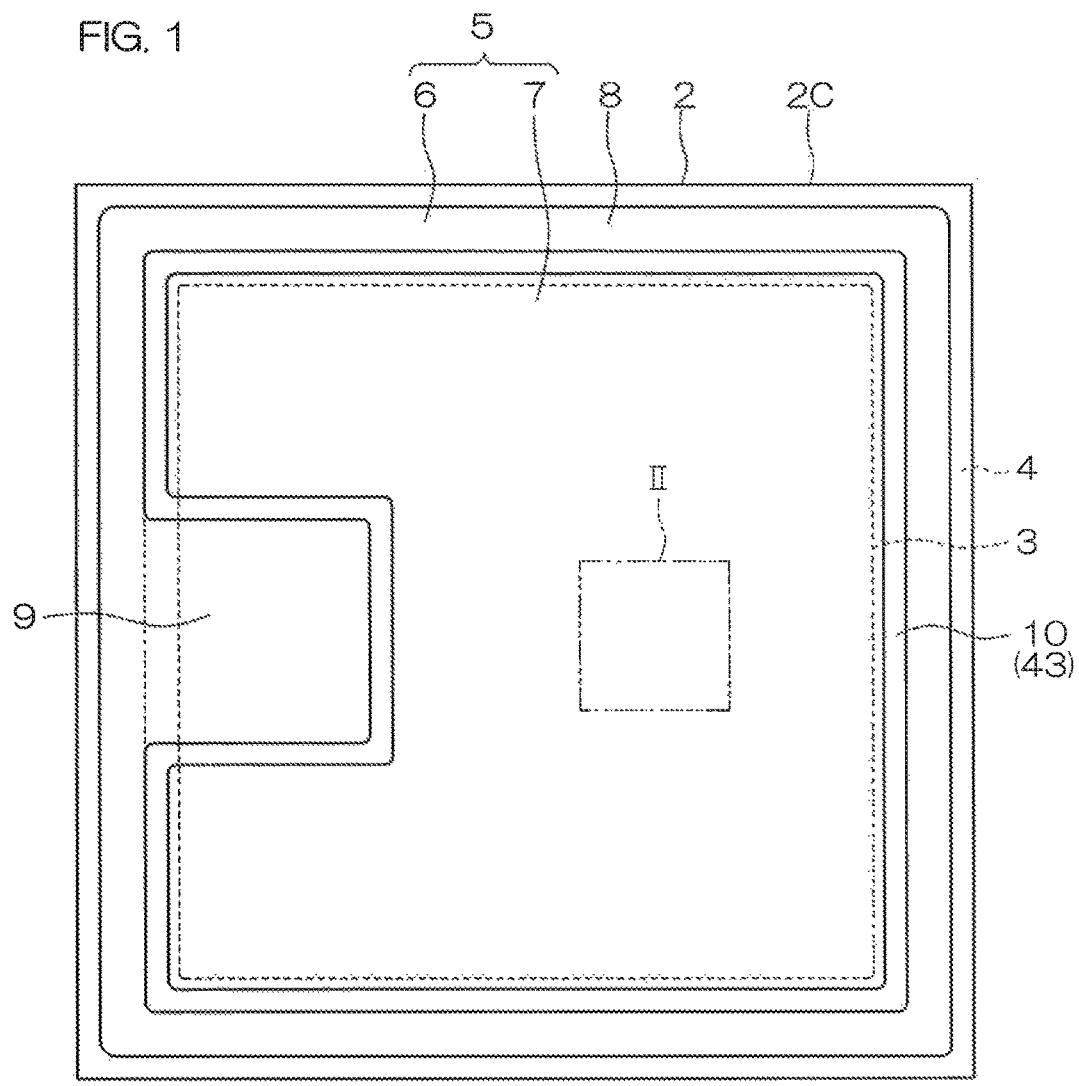
FIG. 1 is a plan view of a semiconductor device according to a first preferred embodiment of the present invention.

In the conventional RC-IGBT disclosed in U.S. 2010/276727, a substantially linear relationship is held between a total surface area of the plurality of cathode regions and a peak forward surge current tolerance. The peak forward surge current tolerance is defined as a tolerance against a peak forward surge current $I_{FSM}$.

That is, in a case where the total area of the plurality of cathode regions is increased, the peak forward surge current tolerance increases. Also, in a case where the total area of the plurality of cathode regions is decreased, the peak forward surge current tolerance decreases.

Therefore, in the conventional RC-IGBT, even if the total area of the plurality of cathodes is adjusted, the peak forward surge current tolerance can only be adjusted within the linear relationship. It is thus difficult to adjust the peak forward surge current tolerance deviating from the linear relationship and a design freedom is low.

A preferred embodiment of the present invention thus provides a semiconductor device capable of increasing design freedom and improving the peak forward surge current tolerance.

One preferred embodiment of the present invention provides a semiconductor device that includes a semiconductor layer having a first principal surface on one side thereof and a second principal surface on the other side thereof a channel region of a first conductivity type formed at a surface layer portion of the first principal surface of the semiconductor layer, an emitter region of a second conductivity type formed at a surface layer portion of the channel region in the semiconductor layer, a drift region of the second conductivity type formed in a region of the second principal surface side with respect to the channel region in the semiconductor layer so as to be electrically connected to the channel region, a collector region of the first conductivity type formed at a surface layer portion of the second principal surface of the semiconductor layer so as to be electrically connected to the drift region, a cathode region of the second conductivity type formed at a surface layer portion of the second principal surface of the semiconductor layer so as to be electrically connected to the drift region and including a continuously laid around line-shaped pattern, and a gate electrode formed at the first principal surface side of the semiconductor layer so as to face the channel region across an insulating film.

According to the semiconductor device, the collector region of the first conductivity type and the cathode region of the second conductivity type are formed at the surface layer portion of the second principal surface of the semiconductor layer. In this structure, the collector region includes the line-shaped pattern continuously laid around the surface layer portion of the second principal surface of the semiconductor layer. According to the cathode region having such an arrangement, the peak forward surge current tolerance can be adjusted deviating from an area of the cathode region.

That is, the peak forward surge current tolerance can be increased while deviating from the linear relationship between the area of the cathode region and the peak forward surge current tolerance held in the conventional RC-IGBT. Further, the peak forward surge current tolerance can be adjusted by adjusting a region in which the cathode region is laid around at the second principal surface of the semiconductor layer. The design freedom can thus be increased.

The preferred embodiment of the present invention shall now be described in detail with reference to the attached drawings.

FIG. 1 is a plan view of a semiconductor device 1 according to a first preferred embodiment of the present invention.

The semiconductor device 1 is a switching device that includes a Reverse Conducting—Insulated Gate Bipolar Transistor (an RC-IGBT). The RC-IGBT includes an IGBT and a free wheeling diode.

Referring to FIG. 1, the semiconductor device 1 includes a semiconductor substrate 2 as an example of a semiconductor layer. The semiconductor substrate 2 maybe an FZ substrate (Floating Zone substrate) that is made of silicon and is formed by an FZ method. The semiconductor substrate 2 is formed in a chip shape of quadrilateral shape in plan view.

The semiconductor substrate 2 includes a front surface 2a, a rear surface 2b positioned on a side of the front surface 2a, and side surfaces 2c connecting the front surface 2a and the rear surface 2b. An active region 3 and an outer region 4 are set in the semiconductor substrate 2.

The active region 3 is a region in which a portion of the IGBT and a portion of the freewheeling diode are formed. The active region 3 is set in an inner region of the semiconductor substrate 2. The active region 3 is set to a quadrilateral shape parallel to the respective side surfaces 2c of the semiconductor substrate 2 in plan view.

The outer region 4 is a region at an outer side of the active region 3. The outer region 4 is formed in a quadrilateral annular shape surrounding the active region 3 in plan view.

A front surface electrode 5 is formed at the front surface 2a of the semiconductor substrate 2. The front surface electrode 5 supplies electric power to the active region 3. The front surface electrode 5 includes a gate electrode 6 and an emitter electrode 7.

The gate electrode 6 is formed along a periphery of the active region 3 in plan view. More specifically, the gate electrode 6 includes gate finger 8 and a gate pad 9.

The gate finger 8 is formed in the outer region 4 so as to surround the active region 3. The gate finger 8 is formed in a quadrilateral annular shape extending along the respective side surfaces 2C of the semiconductor substrate 2 in plan view.

The gate finger 8 may instead be formed along three side surfaces 2C of the semiconductor substrate 2 so as to define the active region 3 from three directions. The gate finger 8 may also cross the active region 3 in accordance with the size of the active region 3.

The gate pad 9 is formed along one side surface 2C of the semiconductor substrate 2. The gate pad 9 is connected to the gate finger 8 at a central portion in a length direction of the one side surface 2C of the semiconductor substrate 2. The gate pad 9 is formed in a quadrilateral shape parallel to the respective side surfaces 2C of the semiconductor substrate 2 in plan view.

The gate pad 9 may instead be formed along a corner portion connecting two side surfaces 2C extending in mutually orthogonal directions. At the corner portion, the gate pad 9 may be connected to two gate finger 8 extending along mutually orthogonal directions. In a case where the gate finger 8 includes a crossing portion that crosses the active region 3, the gate pad 9 may be connected to the crossing portion of the gate finger 8.

An insulating region 10 is formed inside a region surrounded by the gate electrode 6. The insulating region 10 is a region in which an electrode material is not present. The gate electrode 6 and the emitter electrode 7 are insulated by the insulating region 10. The insulating region 10 is formed in a band shape extending along an inner edge of the gate electrode 6. The insulating region 10 is formed in an endless shape (closed annular shape) in plan view in the present preferred embodiment.

The emitter electrode 7 covers the active region 3. The emitter electrode 7 is formed in a region surrounded by the insulating region 10.

Figure 2:
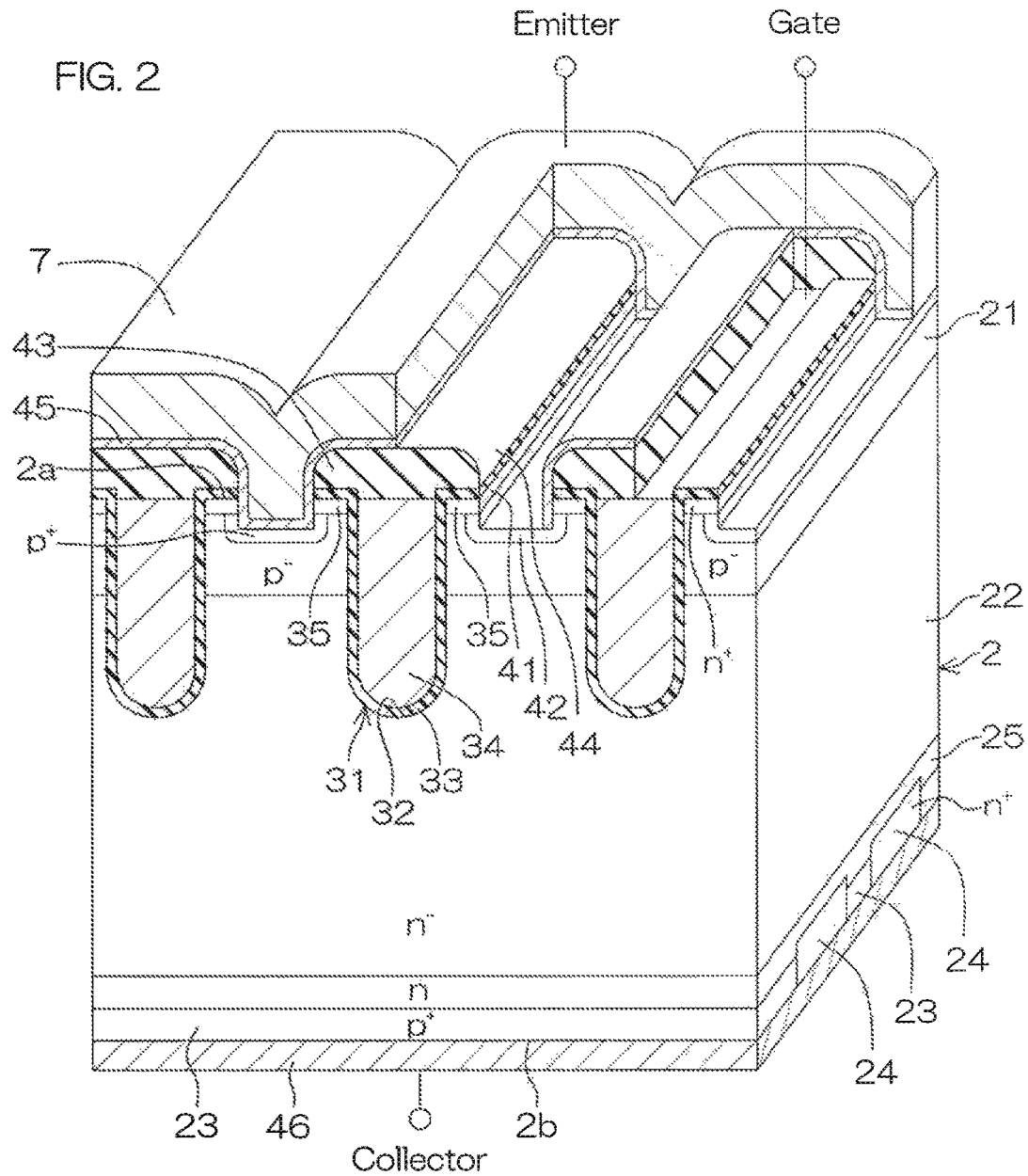
FIG. 2 is partially cutaway perspective sectional view of a region II shown in FIG. 1.

FIG. 2 is a partially cutaway perspective sectional view of a region II shown in FIG. 1.

Referring to FIG. 2, a p$^-$ type channel region 21 is formed at a surface layer portion of the front surface 2a of the semiconductor substrate 2 in the active region 3. The channel region 21 defines the active region 3.

More specifically, the active region 3 is defined by a region surrounded by a peripheral edge of the channel region 21 in plan view. That is, the active region 3 is a region where the channel region 21 is projected onto the front surface 2a and the rear surface 2b of the semiconductor substrate 2.

An n$^-$ type drift region 22 is formed at the rear surface 2b side of the semiconductor substrate 2 with respect to the channel region 21, in the active region 3. The drift region 22 is electrically connected to the channel region 21.

In the present preferred embodiment, an n$^-$ type semiconductor substrate is used as the semiconductor substrate 2. That is, the drift region 22 is formed using a portion of the semiconductor substrate 2.

A p$^+$ type collector region 23 and an n$^+$ type cathode region 24 are formed at a surface layer portion of the rear surface 2b of the semiconductor substrate 2, in the active region 3. The collector region 23 and the cathode region 24 are exposed from the rear surface 2b of the semiconductor substrate 2.

The collector region 23 and the cathode region 24 are electrically connected to the drift region 22, respectively. More specifically, the collector region 23 and the cathode region 24 are electrically connected to the drift region 22 via a buffer region 25. The buffer region 25 is formed so as to extend across a region between the drift region 22 and the collector region 23 and a region between the drift region 22 and the cathode region 24.

An end portion of the cathode region 24 at the front surface 2a side of the semiconductor substrate 2 is positioned inside the buffer region 25 in regard to a thickness direction of the semiconductor substrate 2. That is, the cathode region 24 crosses a boundary of the collector region 23 and the buffer region 25. Specific structures of the collector region 23 and the cathode region 24 shall be described in detail later.

A plurality of trench gate structures 31 is formed at the surface layer portion of the front surface 2a of the semiconductor substrate 2 in the active region 3. Each of the trench gate structures 31 extends in a band shape in plan view. Each of the trench gate structures 31 includes a gate trench 32, a gate insulating film 33, and an embedded gate electrode 34.

Each gate trench 32 is formed by digging the front surface 2a of the semiconductor substrate 2 toward the rear surface 2b side. The gate trench 32 penetrates the channel region 21. A bottom portion of the gate trench 32 is positioned inside the drift region 22. The embedded gate electrode 34 is embedded in the gate trench 32 across the gate insulating film 33. The gate insulating film 33 covers the front surface 2a of the semiconductor substrate 2 as well.

$n^+$ type emitter regions 35 are formed at surface layer portions of the channel region 21. The emitter regions 35 are formed at sides of the respective trench gate structures 31. The emitter regions 35 are exposed from the front surface 2a of the semiconductor substrate 2.

the $n^+$ type emitter regions 35, the $p^-$ type channel region 21, and the $n^-$ type drift region 22 are formed in that order from the front surface 2a side toward the rear surface 2b side of the semiconductor substrate 2 at sides of each trench gate structure 31.

The channel region 21 is shared by the trench gate structures 31. The embedded gate electrodes 34 face the emitter regions 35, the channel region 21, and the drift region 22 across the gate insulating films 33 inside the gate trenches 32.

At the surface layer portion of the channel region 21, contact recess portions 41 are formed in respective regions between the trench gate structures 31. Each contact recess portion 41 is formed in a band shape extending along the trench gate structures 31 in plan view.

The contact recess portions 41 are formed by digging the front surface 2a of the semiconductor substrate 2 toward the rear surface 2b side. Bottom portions of the contact recess portions 41 are positioned inside the channel region 21. Side portions of the contact recess portions 41 expose the emitter regions 35. A depth of the contact recess portion 41 is less than a depth of each gate trench 32 (trench gate structure 31) in regard to the thickness direction of the semiconductor substrate 2.

In the channel region 21, $p^+$ type contact regions 42 are formed in regions, each of which is oriented along the side portions and the bottom portion of a contact recess portion 41. The $p^+$ type contact regions 42 are formed below the emitter regions 35. The contact regions 42 have a p type impurity concentration that is higher than a p type impurity concentration of the channel region 21.

The emitter regions 35 may be exposed from entire side portions of the contact recess portions 41. In this case, the contact regions 42 may be formed only in regions of the channel region 21 oriented along the bottom portions of the contact recess portions 41.

An insulating layer 43 is formed above the front surface 2a of the semiconductor substrate 2. The insulating layer 43 covers the trench gate structures 31. The insulating layer 43 may have a laminated structure in which a plurality of insulating films is laminated. The insulating layer 43 may have a single layer structure constituted of a single insulating film. The insulating layer 43 may include an oxide film ($SiO_2$) or a nitride film (SiN).

Contact holes 44 are formed in the insulating layer 43. The contact holes 44 expose the contact recess portions 41. The contact holes 44 are in communication with the contact recess portions 41. The contact holes 44 are formed in band shapes extending along the same direction as the contact recess portions 41 in plan view. Inner walls of the contact holes 44 are formed so as to be flush with respect to inner walls of the contact recess portions 41.

The emitter electrode 7 is formed via a barrier metal layer 45 above the insulating layer 43. The barrier metal layer 45 is a metal layer arranged to suppress diffusion of the emitter electrode 7 to outer sides of the contact holes 44 and the contact recess portions 41.

The barrier metal layer 45 has a laminated structure including a titanium layer and a titanium nitride layer laminated in that order from the semiconductor substrate 2 side. The barrier metal layer 45 is formed in a film-like shape. More specifically, the barrier metal layer 45 is formed so that one surface and another surface facing each other are oriented along the inner walls of the contact recess portions 41, the inner walls of the contact holes 44, and the front surface of the insulating layer 43.

The emitter electrode 7 fills the contact recess portions 41 and the contact holes 44 and covers the front surface of the insulating layer 43. Inside the contact recess portions 41, the emitter electrode 7 is electrically connected via the barrier metal layer 45 to the channel region 21, the emitter regions 35, the contact regions 42, etc.

The gate electrode 6 is formed at the insulating layer 43 across an interval from the emitter electrode 7. The insulating region 10 (see also FIG. 1), is formed by the insulating layer 43 exposed from the region between the gate electrode 6 and the emitter electrode 7.

The trench gate structures 31 may be led out from the active region 3 to a region directly below the gate finger 8. The gate finger 8 maybe electrically connected to the trench gate structures 31 via contact holes (not shown) formed in the insulating layer 43.

A collector electrode 46 as a rear surface electrode is formed at the rear surface 2b side of the semiconductor substrate 2. The collector electrode 46 is electrically connected to the collector region 23 and the cathode region 24.

Figure 3:
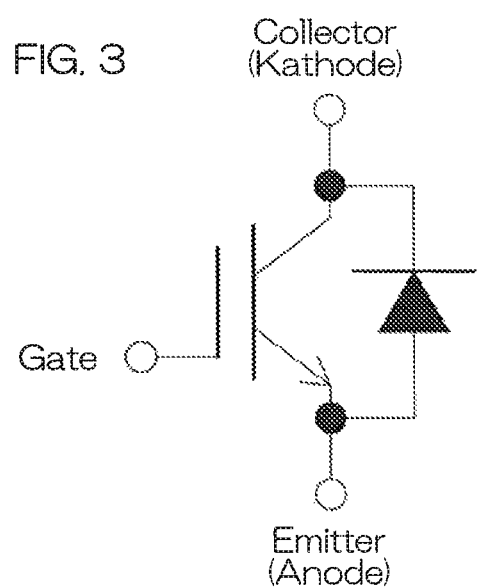
FIG. 3 is a circuit diagram of an electrical structure of the semiconductor device shown in FIG. 1.

FIG. 3 is a circuit diagram of the electrical structure of the semiconductor device 1 shown in FIG. 1.

Referring to FIG. 3, the semiconductor device 1 has a structure where an IGBT and a free wheeling diode are incorporated in the semiconductor substrate 2 in common. The free wheeling diode is formed by a pn junction portion between the channel region 21 and the drift region 22.

The free wheeling diode includes the channel region 21 as an anode region. The free wheeling diode also includes the drift region 22 as a cathode region. The free wheeling diode is electrically connected to the emitter electrode 7 via the channel region 21 and is electrically connected to the collector electrode 46 via the cathode region 24.

The semiconductor device 1 thus has a structure where the anode of the freewheeling diode is electrically connected to the emitter electrode 7 of the IGBT and the cathode of the freewheeling diode is electrically connected to the collector electrode 46 of the IGBT.

Figure 4:
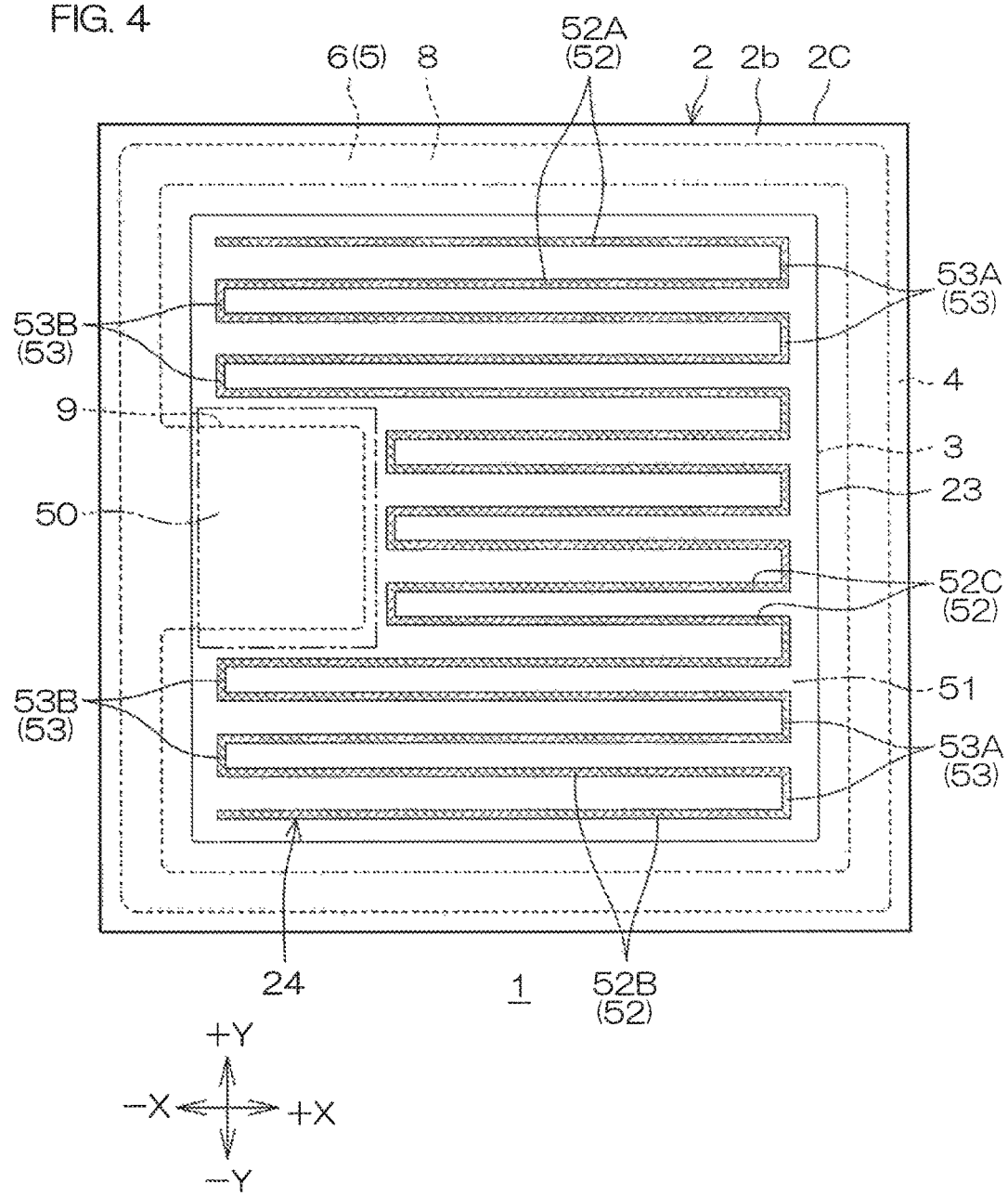
FIG. 4 is a bottom view of the semiconductor device shown in FIG. 1.

The specific arrangement of the cathode region 24 shall now be described with reference to FIG. 4. FIG. 4 is a bottom view of the semiconductor device 1 shown in FIG. 1. For clarification, the cathode region 24 is shown with cross hatching in FIG. 4.

Referring to FIG. 4, in the present preferred embodiment, the collector region 23 is formed in a shape substantially matching a shape of the active region 3 (that is, the shape of the channel region 21) in plan view.

The cathode region 24 includes a line-shaped pattern that is continuously laid around in the active region 3. The cathode region 24 has an n type impurity concentration that is higher than a p type impurity concentration of the collector region 23 in the present preferred embodiment. The cathode region 24 is formed in the active region 3 so that the p type impurity of the collector region 23 is offset by the n type impurity.

A first region 50 and a second region 51 are set in the active region 3. The first region 50 is a region in which only the collector region 23 is formed. The second region 51 is a region in which both the collector region 23 and the cathode region 24 are formed. That is, the second region 51 is a region in which both the IGBT and the free wheeling diode are formed.

The first region 50 is set along a peripheral edge portion of the semiconductor substrate 2. More specifically, the first region 50 is formed along one side surface 2C of the semiconductor substrate 2. Even more specifically, the first region 50 is set in a region positioned directly below the gate pad 9 in the rear surface 2b of the semiconductor substrate 2.

The first region 50 faces the gate pad 9 in regard to the thickness direction of the semiconductor substrate 2. The first region 50 faces a region overlapping o the active region 3 in the gate pad 9. A peripheral edge of the first region 50 may surround a peripheral edge of the region overlapping to the active region 3 in the gate pad 9 in plan view. The first region 50 may be a region defined to have a quadrilateral shape in plan view.

The second region 51 is set in a region outside the first region 50 in the active region 3. The second region 51 is defined to have a recessed shape in plan view. Even more specifically, the second region 51 is set in a region positioned directly below the emitter electrode 7 in the rear surface 2b of the semiconductor substrate 2. The second region 51 faces the emitter electrode 7 in regard to the thickness direction of the semiconductor substrate 2.

In the following, a +X direction, a -X direction, a +Y direction, and a -Y direction shown in FIG. 4 may be used for convenience of description. The +X direction and the -X direction are two directions oriented along one side of the semiconductor substrate 2 and shall be referred to simply as the "X direction" when referred to collectively. The +Y direction and the -Y direction are two directions oriented along another side of the semiconductor substrate 2 orthogonal to the one side and shall be referred to simply as the "Y direction" when referred to collectively. In the present preferred embodiment, the X direction is also a direction in which the gate pad 9 is led out from the gate finger 8.

The cathode region 24 is formed in a non-uniform pattern (a non-uniform arrangement) in the active region 3. More specifically, the cathode region 24 is formed in the second region 51 and is thereby formed in a region that does not face the gate pad 9 in the rear surface 2b of the semiconductor substrate 2.

The cathode region 24 includes a line-shaped pattern that is laid around continuously in a meandering form in the second region 51 in plan view. More specifically, the cathode region 24 includes a plurality of first lines 52 and a plurality of second lines 53.

The plurality of first lines 52 extends along the X direction and is formed at intervals along the Y direction.

The plurality of first lines 52 includes a plurality of first lines 52A, a plurality of first lines 52B, and a plurality of first lines 52C.

The plurality of first lines 52A is formed in a region at a +Y direction end portion side in the active region 3. The plurality of first lines 52B is formed in a region at a -Y direction end portion side in the active region 3. The plurality of first lines 52C is formed in a region between the first lines 52A and the first lines 52B in the active region 3.

The plurality of first lines 52A is led out to a +Y direction side region with respect to the first region 50 (gate pad 9) in the active region 3. The plurality of first lines 52B is led out to a -Y direction side region with respect to the first region 50 (gate pad 9) in the active region 3. The plurality of first lines 52A and the plurality of first lines 52B face each other in the Y direction across the first region 50 (gate pad 9) in plan view. The plurality of first lines 52C is formed in a region facing the first region 50 (gate pad 9) along the X direction in the active region 3.

A length of each first line 52A and a length of each first line 52B are substantially equal in regard to the X direction, in the present preferred embodiment. A length of each first line 52C is less than the length of each first line 52A and the length of each first line 52B in regard to the X direction.

The plurality of second lines 53 extends in the Y direction and connects the first lines 52 that is mutually adjacent in the Y direction. The second lines 53 include a plurality of second lines 53A and a plurality of second lines 53B.

Each of the second lines 53A connects +X direction end portions of two first lines 52 that are mutually adjacent along the Y direction. Each of the second lines 53B connects -X direction end portions of two first lines 52 that are mutually adjacent along the Y direction. The plurality of second lines 53A and the plurality of second lines 53B are formed alternately along the Y direction.

The cathode region 24 is thus formed in the line-shaped pattern of continuously connected meandering form in plan view. Also, the cathode regions 24 include the first lines 52A, 52B, and 52C that respectively differ in the length in the X direction. The cathode region 24 is thereby formed in the pattern that is non-uniform with respect to the active region 3.

A line width of the cathode region 24 defined by a Y direction width of the first line 52 and an X direction width of the second line 53 may be equal to or greater than 1 μm and equal to less than 100μm. The line width of the cathode region 24 is preferably equal to or greater than 10 μm and equal to or less than 50 μm.

The cathode region 24 may have a uniform line width. The cathode region 24 may have a line width that is not uniform. The cathode region 24 may have the first lines 52A, 52B, 52C that respectively differ in Y direction width. The cathode region 24 may have the second lines 53A, 53B that respectively differ in X direction width.

A ratio $S_1/S_A$ of an area $S_1$ of the first region 50 with respect to an area $S_A$ of the active region 3 is, for example, equal to or greater than 0.03 (3%) and equal to or less than 0.3 (30%).

A ratio $S_K/S_A$ of an area of the cathode region 24 with respect to the area $S_A$ of the active region 3 is less than a ratio $S_C/S_A$ of an area $S_C$ of the collector region 23 with respect to the area $S_A$ of the active region 3. The ratio $S_K/S_A$ shall be referred to as the "area ratio $S_K/S_A$ of the cathode region 24" in the description that follows. Also, the ratio $S_C/S_A$ shall be referred to as the "area ratio $S_C/S_A$ of the collector region 23" in the description that follows.

The area ratio $S_K/S_A$ of the cathode region 24 may be equal to or less than 0.1 (10%). The area ratio $S_K/S_A$ of the cathode region 24 is preferably equal to or greater than 0.01 (1%) and equal to or less than 0.07 (7%).

A semiconductor device 101 according to a reference example shown in FIG. 5 was prepared for comparison with electrical characteristics of the semiconductor device 1. FIG. 5 is a bottom view of the semiconductor device 101 according to the reference example. In FIG. 5, the same reference numerals are applied to the same structures as those described in the semiconductor device 1, and the descriptions thereof will be omitted.

Referring to FIG. 5, a plurality of cathode regions 24 is formed in the active region 3 in the semiconductor device 101. Each of the cathode regions 24 is formed in a circular shape in plan view.

The plurality of cathode regions 24 is formed in a uniform pattern. More specifically, the plurality of cathode regions 24 is formed in a matrix pattern at intervals along the X direction and the Y direction. The cathode regions 24 are also formed in a region directly below the gate pad 9 in the semiconductor device 101.

Figure 6:
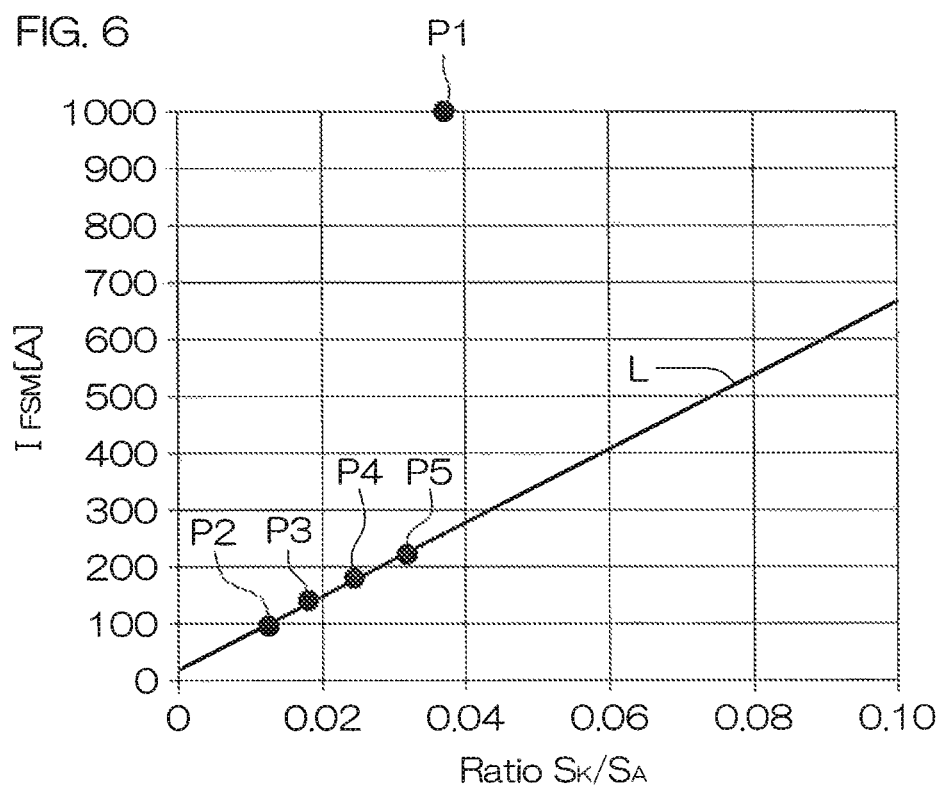
FIG. 6 is a graph obtained by simulation of a peak forward surge current tolerance of the semiconductor device shown in FIG. 1.

FIG. 6 is a graph obtained by simulation of the peak forward surge current $I_{FSM}$ of the semiconductor device 1. In FIG. 6, an abscissa indicates the area ratio $S_K/S_A$ of the cathode region 24 and an ordinate indicates the peak forward surge current $I_{FSM}$.

The peak forward surge current $I_{FSM}$ is the peak value of a commercial sinusoidal current of not less than one cycle that is tolerated within a range in which a semiconductor device does not break down. The higher the peak forward surge current $I_{FSM}$ the better the tolerance of the semiconductor device against the peak forward surge current $I_{FSM}$ (hereinafter referred to simply as the "peak forward surge current tolerance").

A plotted point P1 and plotted points P2, P3, P4, P5 are shown in the graph of FIG. 6. The plotted points P2, P3, P4, P5 are connected by an approximation line L.

The plotted point P1 indicates the peak forward surge current $I_{FSM}$ simulation result when the area ratio $S_K/S_A$ of the cathode region 24 is 0.037 (3.7%) in the semiconductor device 1.

The plotted points P2, P3, P4, P5 indicate the peak forward surge current $I_{FSM}$ simulation results when the area ratio $S_K/S_A$ of the cathode regions 24 is 0.012 (1.2%), 0.019 (1.9%), 0.023 (2.3%), 0.032 (3.2%), respectively, in the semiconductor device 101.

Referring to the approximation line L, the peak forward surge current $I_{FSM}$ decreases as the area ratio $S_K/S_A$ of the cathode regions 24 decreases in the semiconductor device 101. On the other hand, the peak forward surge current $I_{FSM}$ increases as the area ratio $S_K/S_A$ of the cathode regions 24 increases in the semiconductor device 101.

The approximation line L of the semiconductor device 101 thus shows a substantially linear relationship held between the area $S_k$ of the plurality of cathodes 24 and the peak forward surge current $I_{FSM}$.

However, the peak forward surge current $I_{FSM}$ of the semiconductor device 101 is equal to or less than 300 A and is a relatively small value in all cases of the area ratio $S_K/S_A$ of the cathode regions 24.

Referring to the approximation line L, it may be considered that a satisfactory peak forward surge current $I_{FSM}$ can be realized in a case where the area ratio $S_K/S_A$ of the cathode regions 24 is made close to "1" in the semiconductor device 101.

However, in actuality, as the area ratio $S_K/S_A$ of the cathode regions 24 is made closer to "1", the area ratio $S_C/S_A$ of the collector region 23 becomes closer to "0" and the function as the IGBT is thus lost. Therefore, even if the area ratio $S_K/S_A$ of the cathode regions 24 is varied to vary the area $S_k$ of the plurality of cathodes 24, the peak forward surge current $I_{FSM}$ can consequently be adjusted only within the linear relationship.

Therefore, it is difficult to obtain a relatively high peak forward surge current $I_{FSM}$ in the semiconductor device 101. Even if the plurality of cathode regions 24 is formed in a quadrilateral shape or other polygonal shape in plan view instead of the circular shape, the same problem arises.

Referring to the plotted point P1, according to the semiconductor device 1, the peak forward surge current $I_{FSM}$ of equal to or greater than 1000 A is realized. That is, the semiconductor device 1 has the peak forward surge current $I_{FSM}$ in a relatively high region deviating from the linear relationship held in the semiconductor device 101.

From the above results, it was understood that the relatively high peak forward surge current $I_{FSM}$ can be realized deviating from the approximation line L by forming the cathode region 24 including the continuous line-shaped pattern.

Figure 7:
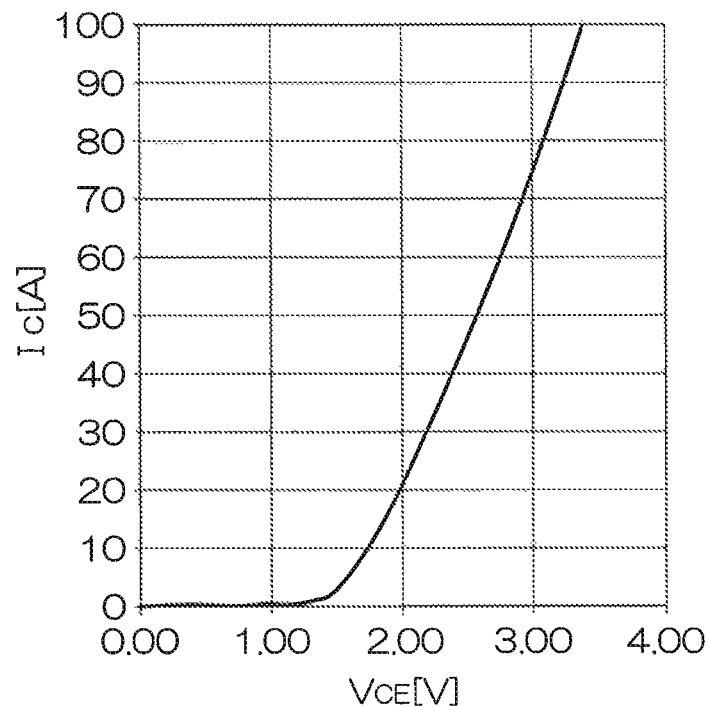
FIG. 7 is a graph obtained by simulation of a collector current of the semiconductor device shown in FIG. 1.

FIG. 7 is a graph obtained by simulation of a collector current $I_C$ of the semiconductor device 1 shown in FIG. 1. In FIG. 7, an abscissa indicates a collector-emitter voltage $V_{CE}$ and an ordinate indicates the collector current $I_C$.

Characteristics of the collector current $I_C$ when the semiconductor device 1 is operated as the IGBT by applying the collector-emitter voltage $V_{CE}$ between the collector electrode 46 and the emitter electrode 7 are shown in FIG. 7.

Generally, according to a semiconductor device including an RC-IGBT, there is a possibility of occurrence of a snap-back phenomenon when a collector-emitter voltage $V_{CE}$ of relatively small value (for example, within a range of equal to or greater than 0V and equal to or less than 2.5V) is applied.

As shown in FIG. 7, according to the semiconductor device 1, occurrence of the snap-back phenomenon is suppressed even when a collector-emitter voltage $V_{CE}$ of relatively small value is applied. The reason for this is considered to be because the first region 50 having the relatively large area that includes only the collector region 23 is formed in the active region 3.

From the above results, it was understood that the semiconductor device 1 can be stably operated as the IGBT even when the cathode region 24 including the continuous line-shaped pattern is formed.

Figure 8:
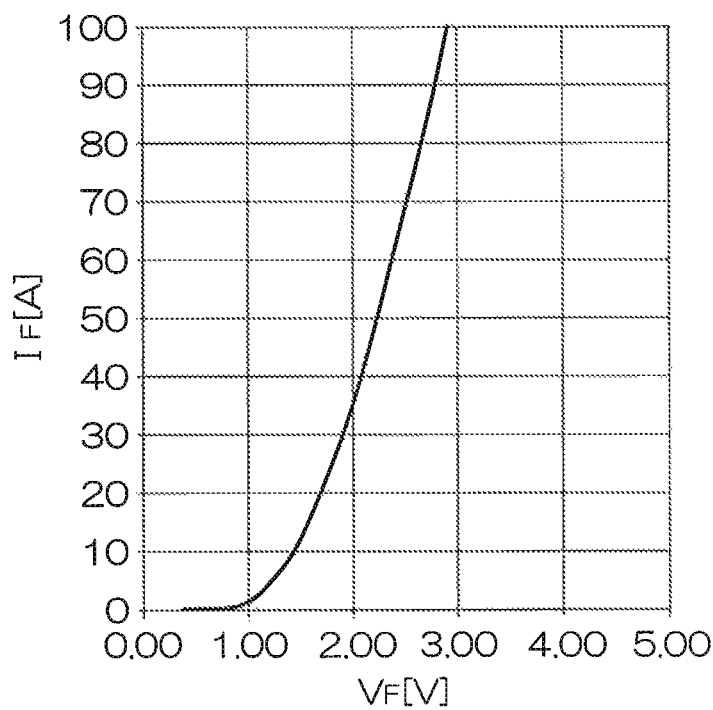
FIG. 8 is a graph obtained by simulation of a forward current of the semiconductor device shown in FIG. 1.

FIG. 8 is a graph obtained by simulation of a forward current $I_F$ of the semiconductor device 1 shown in FIG. 1. In FIG. 8, an abscissa indicates a forward voltage $V_F$ and an ordinate indicates the forward current $I_F$.

Characteristics of the forward current $I_F$ when the semiconductor device 1 is made to operate as a free wheeling diode by applying the forward voltage $V_F$ between the collector electrode 46 and the emitter electrode 7 are shown in FIG. 8.

Referring to FIG. 8, it was understood that the semiconductor device 1 can be stably operated as a free wheeling diode even when the cathode region 24 including the continuous line-shaped pattern is formed.

As described above, the semiconductor device 1 has the cathode region 24 that includes the continuously laid around line-shaped pattern at the surface layer portion of the rear surface 2b of the semiconductor substrate 2. Therefore, in the semiconductor device 1, the peak forward surge current $I_{FSM}$ of relatively high value can be set deviating from the approximation line L that the semiconductor device 101 according to the reference example has.

Further, the peak forward surge current $I_{FSM}$ can be adjusted easily by adjusting the region in which the cathode region 24 is laid around within the active region 3 (second region 51) at the rear surface 2b side of the semiconductor substrate 2. The design freedom can thus be increased.

Consequently, the semiconductor device 1 capable of increasing the design freedom and improving the peak forward surge current tolerance.

Figure 9:
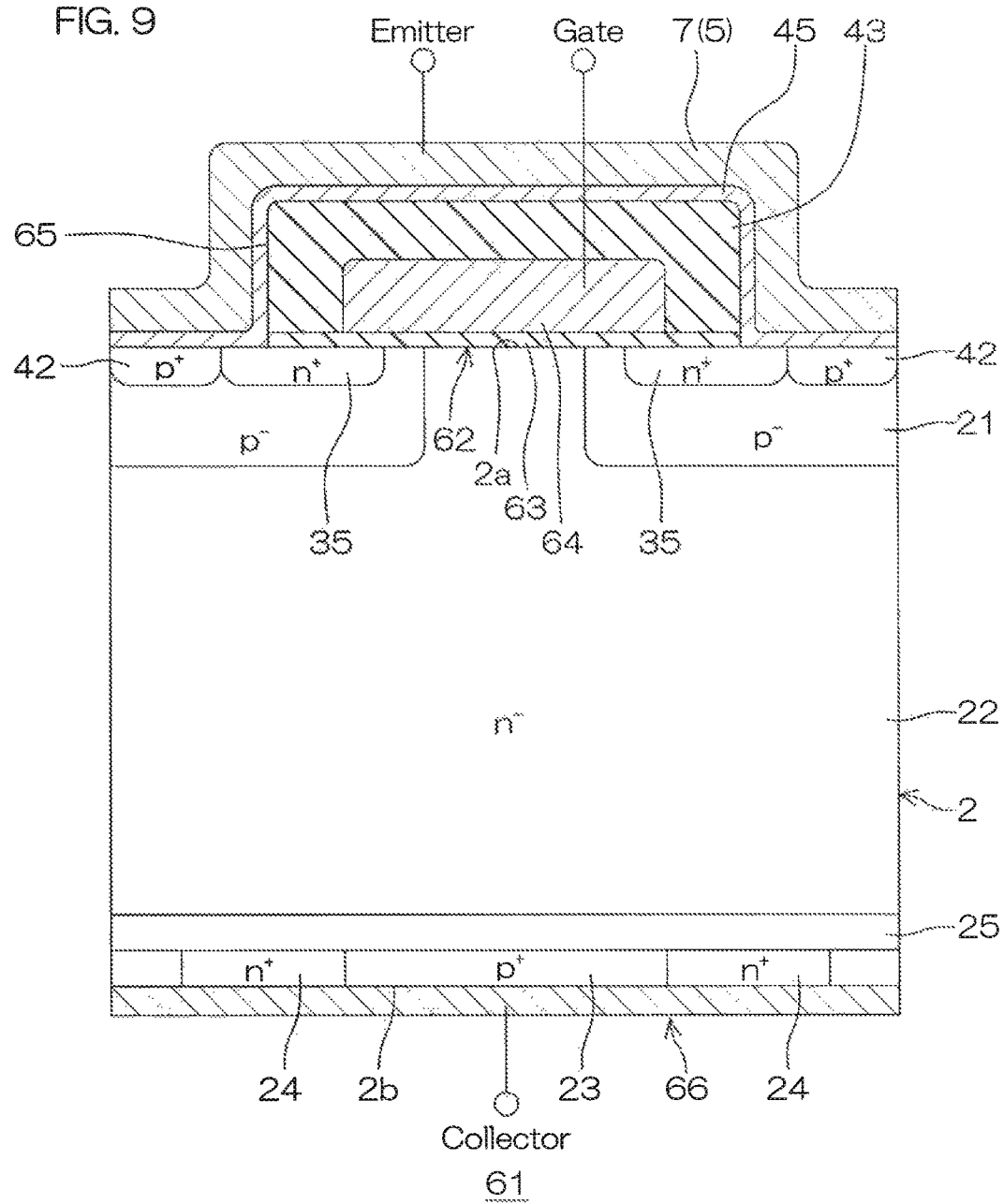
FIG. 9 is a sectional view of a semiconductor device according to a second preferred embodiment of the present invention.

FIG. 9 is a sectional view of a semiconductor device 61 according to a second preferred embodiment of the present invention. In FIG. 9, the same reference numerals are applied to the same structures as those described in the semiconductor device 1, and the descriptions thereof will be omitted.

Referring to FIG. 9, the channel regions 21 are formed at intervals at the surface layer portion of the front surface 2a of the semiconductor substrate 2. The emitter region 35 is formed at the surface layer portion of each channel region 21. The emitter region 35 is formed at intervals from a peripheral edge of the channel region 21 to an inner side.

The drift region 22 is formed in a region at the rear surface 2b side of the semiconductor substrate 2 with respect to the channel regions 21. The drift region 22 is also formed in regions between the channel regions 21 mutually adjacent. The drift region 22 is electrically connected to the channel regions 21.

The collector region 23 and the cathode region 24 are formed at the surface layer portion of the rear surface 2b of the semiconductor substrate 2. The collector region 23 and the cathode region 24 are electrically connected to the drift region 22 via the buffer region 25. The collector region 23 and the cathode region 24 have the same arrangements as in the first preferred embodiment.

A planar gate structure 62 is formed at the front surface 2a of the semiconductor substrate 2. The planar gate structure 62 has a laminated structure in which a gate insulating film 63 and a gate electrode 64 are laminated in that order from the front surface 2a side of the semiconductor substrate 2.

The gate electrode 64 faces at least the channel regions 21 across the gate insulating film 63. More specifically, the gate electrode 64 faces the emitter regions 35, the channel regions 21, and the drift region 22 across the gate insulating film 63.

The contact regions 42 are formed in regions opposite sides from the gate electrode 64 with respect to the emitter regions 35 in the surface layer portions of the channel regions 21.

The active region 3 is defined by a region in which a plurality of unit cells 66 is formed in the present preferred embodiment. Each unit cell 66 is a region in which two channel regions 21 are formed with respect to one planar gate structure 62.

The insulating layer 43 is formed at the front surface 2a of the semiconductor substrate 2. The insulating layer 43 covers the planar gate structure 62. A contact hole 65 is formed in the insulating layer 43. The contact hole 65 exposes the channel regions 21 and the emitter regions 35.

The emitter electrode 7 is formed above the insulating layer 43 across the barrier metal layer 45. The emitter electrode 7 enters into the contact hole 65 from above the insulating layer 43. Inside the contact hole 65, the emitter electrode 7 is electrically connected to the channel regions 21, the emitter regions 35, and the contact regions 42.

According to the semiconductor device 61, the same effects as the effects described above in the first preferred embodiment can be exhibited.

Although preferred embodiments of the present invention have been described above, the present invention may be implemented in yet other modes.

Figure 10:
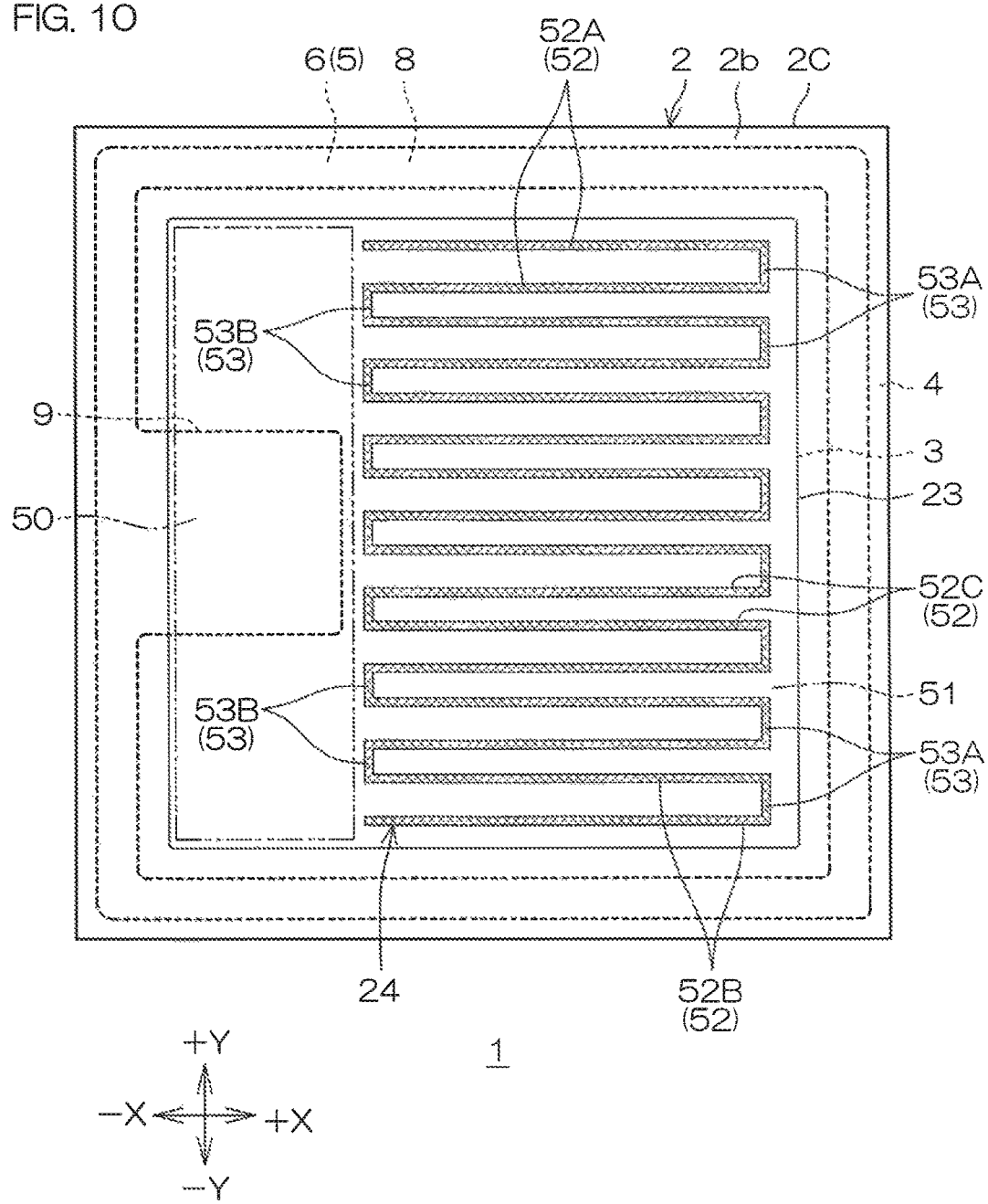
FIG. 10 is a bottom view of the semiconductor device shown in FIG. 1 and shows a first modification example of a cathode region.
Figure 11:
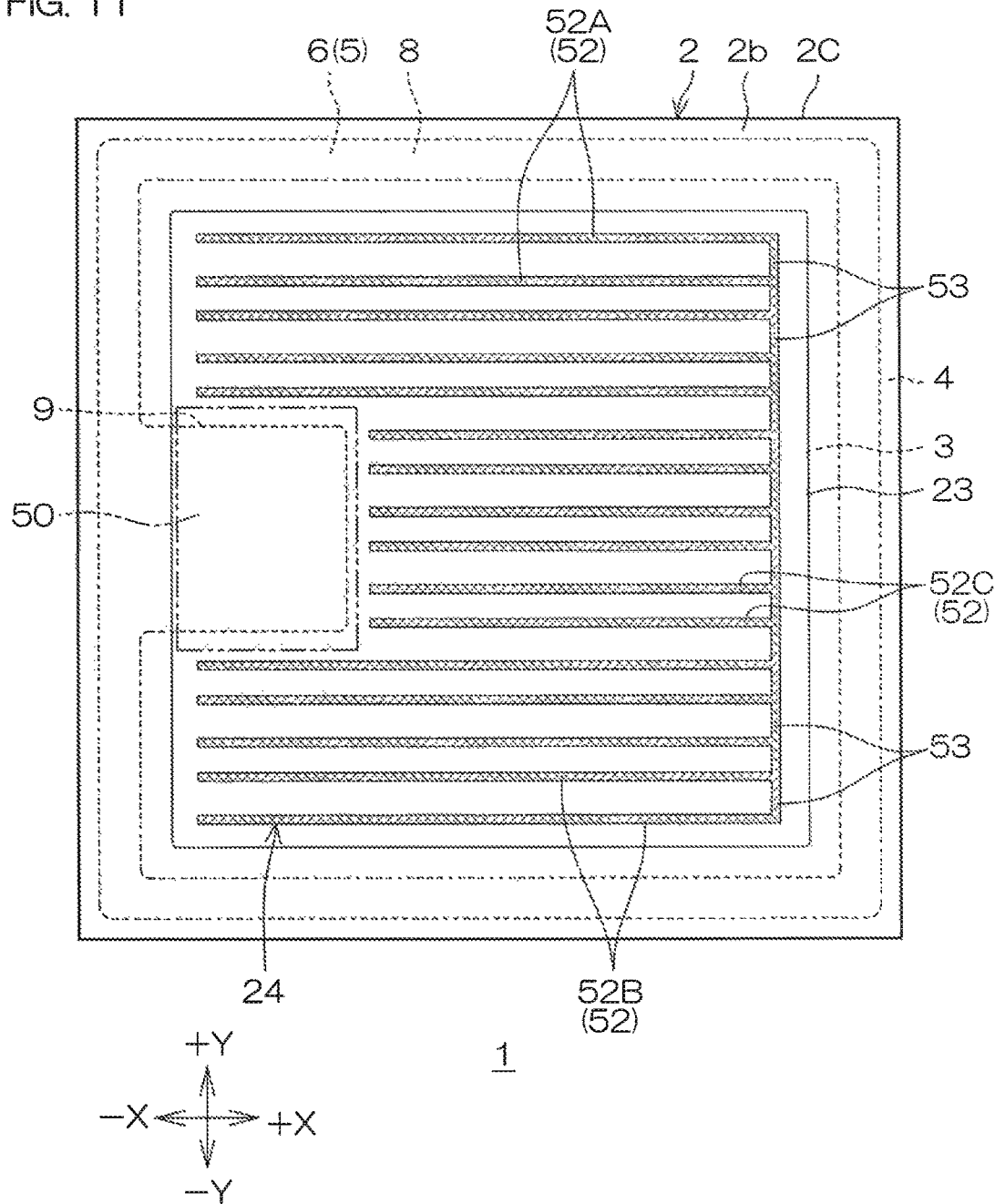
FIG. 11 is a bottom view of the semiconductor device shown in FIG. 1 and shows a second modification example of a cathode region.
Figure 12:
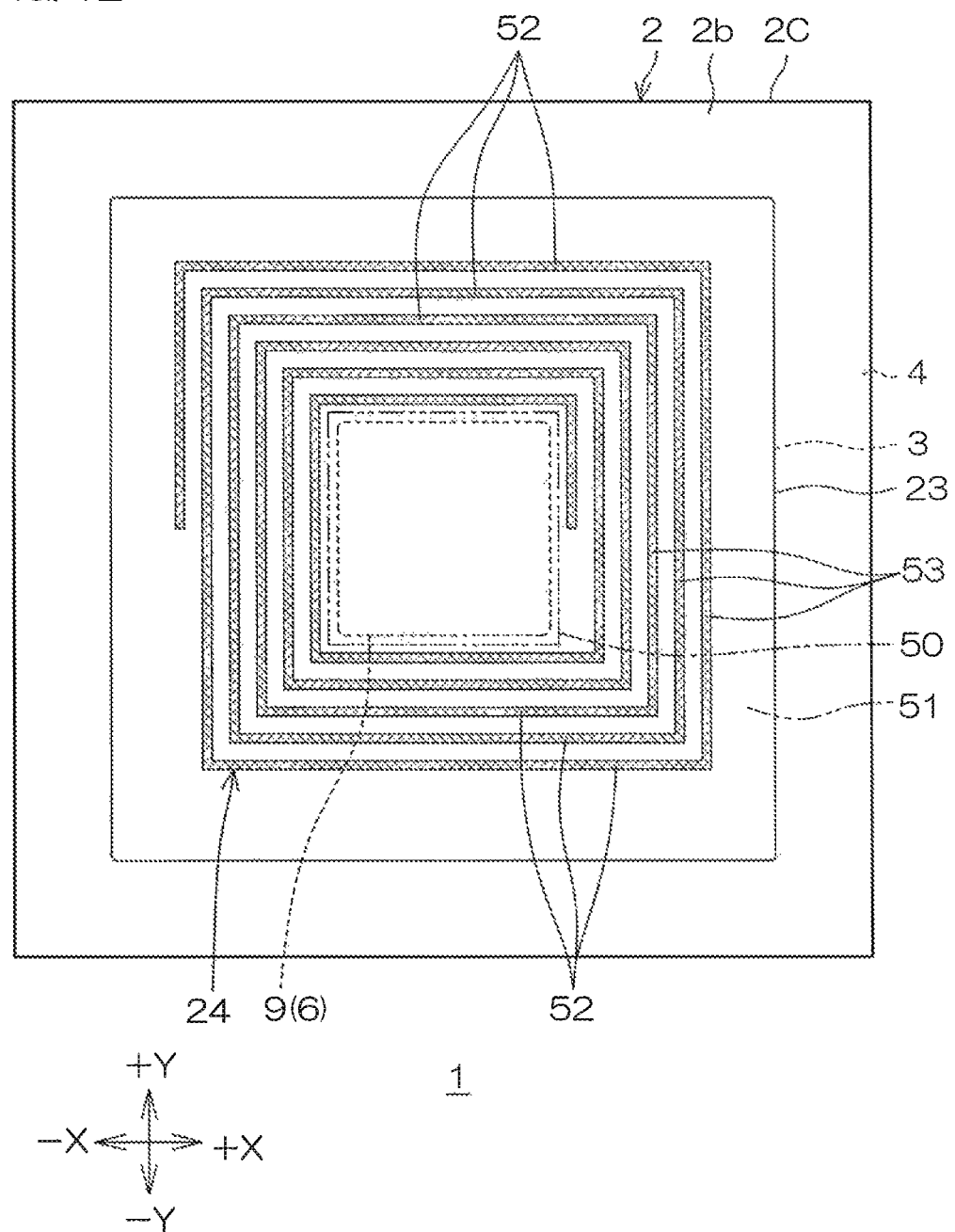
FIG. 12 is a bottom view of the semiconductor device shown in FIG. 1 and shows a third modification example of a cathode region.

In the first preferred embodiment described above, the cathode region 24 that includes a pattern of any of FIG. 10 to FIG. 12 may be formed in place of the cathode region 24 that includes the line-shaped pattern extending in a meandering manner.

FIG. 10 is a bottom view of the semiconductor device 1 shown in FIG. 1 and shows a first modification example of the cathode region 24. In FIG. 10, the same reference numerals are applied to the same structures as those described in the semiconductor device 1, and the descriptions thereof will be omitted. For clarification, the cathode region 24 is shown with cross hatching in FIG. 10.

Referring to FIG. 10, the cathode region 24 includes a plurality of first lines 52 and a plurality of second lines 53. The plurality of first lines 52 extends along the X direction and is formed at intervals along the Y direction. The plurality of second lines 53 extends in the Y direction and connects the first lines 52 that are mutually adjacent in the Y direction.

In the cathode region 24, the lengths of the first lines 52A, 52B are respectively substantially equal to the length of the first lines 52C in regard to the X direction. The plurality of first lines 52A and the plurality of first lines 52B thus do not face each other in the Y direction across the first region 50 (gate pad 9) in plan view.

The cathode region 24 is thereby localized in a region at the +X direction side of the active region 3. The first region 50 is formed in a rectangular shape extending along the Y direction in plan view in a region at the −X direction side of the active region 3.

The cathode region 24 according to the present modification example is thus localized in a non-uniform pattern in the region at the +X direction side of the active region 3. Even when the semiconductor device 1 has the cathode region 24 of such structure, the same effects as the effects described in the first preferred embodiment can be exhibited. The cathode region 24 according to the present modification example may also be applied to the second preferred embodiment described above.

FIG. 11 is a bottom view of the semiconductor device 1 shown in FIG. 1 and shows a second modification example of the cathode region 24. In FIG. 11, the same reference numerals are applied to the same structures as those described in the semiconductor device 1, and the descriptions thereof will be omitted. For clarification, the cathode region 24 is shown with cross hatching in FIG. 11.

Referring to FIG. 11, the cathode region 24 includes a plurality of first lines 52 and a plurality of second lines 53. The plurality of first lines 52 extends along the X direction and is formed at intervals along the Y direction.

The plurality of second lines 53 extends in the Y direction and connects the first lines 52 that is mutually adjacent in the Y direction. Each of the second lines 53 connects the +X direction end portions of two first lines 52 that are mutually adjacent along the Y direction in the cathode region 24 according to the present modification example.

The cathode region 24 according to the present modification example thus includes a line-shaped pattern of comb teeth form in plan view and is formed in a non-uniform pattern in the active region 3. The same effects as the effects described with the first preferred embodiment can be exhibited even when the semiconductor device 1 has the cathode region 24 of such structure. The cathode region 24 according to the present modification example may also be applied to the second preferred embodiment described above.

FIG. 12 is a bottom view of the semiconductor device 1 shown in FIG. 1 and shows a third modification example of the cathode region 24. In FIG. 12, the same reference numerals are applied to the same structures as those described in the semiconductor device 1, and the descriptions thereof will be omitted. For clarification, the cathode region 24 is shown with cross hatching in FIG. 12.

The gate pad 9 is formed at a central portion of the semiconductor substrate 2 in plan view in the present modification example. The first region 50 is thus set at a central portion of the active region 3 in plan view. The first region 50 is formed in a quadrilateral shape in plan view. The second region 51 is set to a quadrilateral annular shape surrounding the first region 50.

The cathode region 24 includes a plurality of first lines 52 and a plurality of second lines 53. The plurality of first lines 52 extends along the X direction and is formed at intervals along the Y direction. The plurality of second lines 53 extends in the Y direction and connects the first lines 52 that are mutually adjacent in the Y direction.

The cathode region 24 according to the present modification example includes a line-shaped pattern of spiral form formed by the plurality of first lines 52 and the plurality of second lines 53. The cathode region 24 according to the present modification example is formed in a quadrilateral spiral from parallel to the respective side surfaces 2c of the semiconductor substrate 2 in plan view.

The cathode region 24 may be formed instead to a circular spiral form in plan view. The cathode region 24 may also be formed in an octagonal spiral form or other spiral form of polygonal shape besides a quadrilateral in plan view.

The cathode region 24 according to the present modification example is thus localized in a non-uniform pattern in a region at peripheral edge portion sides of the active region 3. The same effects as the effects described with the first preferred embodiment can be exhibited even when the semiconductor device 1 has the cathode region 24 of such structure. The cathode region 24 according to the present modification example may also be applied to the second preferred embodiment described above.

In each of the preferred embodiments described above, the cathode region 24 may include a plurality of line-shaped patterns that is formed in a separated from each other and extend continuously respectively. The plurality of line-shaped patterns may have patterns that differ mutually in plan view. The plurality of line-shaped patterns may have mutually equal patterns.

For example, the cathode region 24 may include at least one type of pattern among a first pattern formed in a meandering form in plan view, a second pattern formed in a comb teeth form in plan view, or a third pattern formed in a spiral form in plan view.

In each of the preferred embodiments described above, an example was described where the semiconductor substrate 2 manufactured by the FZ method is adopted as an example of the semiconductor layer. However, the semiconductor layer may include an epitaxial substrate in place of the semiconductor substrate 2.

The epitaxial substrate may have a laminated structure including a p⁻ type semiconductor substrate made of silicon and an n⁻ type epitaxial layer made of silicon and formed above the semiconductor substrate by epitaxial growth.

In this case, the p⁻ type semiconductor substrate corresponds to the collector region 23. Also, the epitaxial layer corresponds to the drift region 22. In this case, the cathode region 24 is formed by implantation of an n type impurity into the p type semiconductor substrate (collector region 23).

An arrangement in which the conductivity types of the respective semiconductor portions are inverted may be adopted in each of the preferred embodiments described above. That is, a p type portion may be of an n type and an n type portion may be of a p type.

The present application corresponds to Japanese Patent Application No. 2016-134335 filed in the Japan Patent Office on Jul. 6, 2016, and the entire disclosure of this application is incorporated herein by reference.

While preferred embodiments of the present invention have been described in detail above, these are merely specific examples used to clarify the technical contents of the present invention, and the present invention should not be interpreted as being limited only to these specific examples, and the scope of the present invention shall be limited only by the appended claims.

What is claimed is:
1. A semiconductor device comprising:
 a semiconductor layer having a first principal surface on one side thereof and a second principal surface on the other side thereof;
 a channel region of a first conductivity type formed at a surface layer portion of the first principal surface of the semiconductor layer;
 an emitter region of a second conductivity type formed at a surface layer portion of the channel region in the semiconductor layer;
 a drift region of the second conductivity type formed in a region of the second principal surface side with respect to the channel region in the semiconductor layer so as to be electrically connected to the channel region;
 a collector region of the first conductivity type formed at a surface layer portion of the second principal surface of the semiconductor layer so as to be electrically connected to the drift region;
 a cathode region of the second conductivity type formed at a surface layer portion of the second principal surface of the semiconductor layer so as to be electrically connected to the drift region and including a line-shaped pattern continuously laid around, the line-shaped pattern including a pattern extending in a meandering form as viewed in plan; and
 a gate electrode formed at the first principal surface side of the semiconductor layer so as to face the channel region across an insulating film.
2. The semiconductor device according to claim 1, wherein the cathode region is formed in non-uniform pattern at the second principal surface of the semiconductor layer.
3. The semiconductor device according to claim 1, wherein the second principal surface of the semiconductor layer has a first region where only the collector region is formed, and a second region where the collector region and the cathode region are formed, and
 the first region is set at a peripheral edge portion of the second principal surface of the semiconductor layer.
4. The semiconductor device according to claim 1, wherein the second principal surface of the semiconductor layer has a first region where only the collector region is formed, and a second region where the collector region and the cathode region are formed, and
 the first region is set at a central portion of the second principal surface of the semiconductor layer.

5. The semiconductor device according to claim 1, further comprising a gate pad formed at the first principal surface of the semiconductor layer so as to be electrically connected to the gate electrode,
wherein the cathode region is formed in a region outside a region facing the gate pad in the second principal surface of the semiconductor layer.

6. The semiconductor device according to claim 1, wherein the line-shaped pattern of the cathode region includes a pattern extending in a comb teeth form as viewed in plan.

7. The semiconductor device according to claim 1, wherein the line-shaped pattern of the cathode region includes a pattern extending in a spiral form as viewed in plan.

8. The semiconductor device according to claim 1, wherein the cathode region includes a first line extending along a first direction, and a second line extending along a second direction intersecting the first direction.

9. The semiconductor device according to claim 1, wherein the cathode region includes a plurality of first lines extending along a first direction and formed at intervals along a second direction intersecting the first direction, and a second line extending along the second direction and connected to the first lines adjacent mutually.

10. The semiconductor device according to claim 1, further comprising a collector electrode formed at the second principal surface of the semiconductor layer and electrically connected to the collector region and the cathode region.

11. The semiconductor device according to claim 1, wherein
the semiconductor layer has an active region,
the collector region is formed in the active region, and
the cathode region is formed in the active region.

12. The semiconductor device according to claim 11, wherein a ratio $S_K/S_A$ of an area $S_K$ of the cathode region with respect to an area $S_A$ of the active region is less than a ratio $S_c/S_A$ of an area $S_c$ of the collector region with respect to the area $S_A$ of the active region.

13. The semiconductor device according to claim 12, wherein the ratio $S_K/S_A$ is equal to or less than 0.1.

14. A semiconductor device comprising:
a semiconductor layer having a first principal surface on one side thereof and a second principal surface on the other side thereof;
a channel region of a first conductivity type formed at a surface layer portion of the first principal surface of the semiconductor layer;
an emitter region of a second conductivity type formed at a surface layer portion of the channel region in the semiconductor layer;
a drift region of the second conductivity type formed in a region of the second principal surface side with respect to the channel region in the semiconductor layer so as to be electrically connected to the channel region;
a collector region of the first conductivity type formed at a surface layer portion of the second principal surface of the semiconductor layer so as to be electrically connected to the drift region;
a cathode region of the second conductivity type formed at a surface layer portion of the second principal surface of the semiconductor layer so as to be electrically connected to the drift region and including a line-shaped pattern continuously laid around, the line-shaped pattern including a pattern extending in a comb teeth form as viewed in plan; and
a gate electrode formed at the first principal surface side of the semiconductor layer so as to face the channel region across an insulating film.

15. A semiconductor device comprising:
a semiconductor layer having a first principal surface on one side thereof and a second principal surface on the other side thereof;
a channel region of a first conductivity type formed at a surface layer portion of the first principal surface of the semiconductor layer;
an emitter region of a second conductivity type formed at a surface layer portion of the channel region in the semiconductor layer;
a drift region of the second conductivity type formed in a region of the second principal surface side with respect to the channel region in the semiconductor layer so as to be electrically connected to the channel region;
a collector region of the first conductivity type formed at a surface layer portion of the second principal surface of the semiconductor layer so as to be electrically connected to the drift region;
a cathode region of the second conductivity type formed at a surface layer portion of the second principal surface of the semiconductor layer so as to be electrically connected to the drift region and including a line-shaped pattern continuously laid around, the line-shaped pattern including a pattern extending in a spiral form as viewed in plan; and
a gate electrode formed at the first principal surface side of the semiconductor layer so as to face the channel region across an insulating film.

* * * * *